(12) United States Patent
Imai

(10) Patent No.: US 6,317,502 B1
(45) Date of Patent: Nov. 13, 2001

(54) ELECTRONIC VOLUME CONTROL CIRCUIT WITH CONTROLLED OUTPUT CHARACTERISTIC

(75) Inventor: Katsumi Imai, Ota (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 08/805,291

(22) Filed: Feb. 25, 1997

(30) Foreign Application Priority Data

Feb. 29, 1996 (JP) .................................................. 8-043688
Mar. 25, 1996 (JP) .................................................. 8-068385

(51) Int. Cl.$^7$ ............................. H03G 3/00; H03F 21/00
(52) U.S. Cl. ........................ 381/104; 381/120; 330/257; 330/254
(58) Field of Search ........................... 381/104, 101, 381/106, 102, 107, 109, 108, 120, 123; 330/257, 288, 278, 254, 279; 307/24; 327/53

(56) References Cited

U.S. PATENT DOCUMENTS

| | | | | |
|---|---|---|---|---|
| 3,870,964 | * | 3/1975 | Mills ..................................... | 330/284 |
| 4,888,810 | * | 12/1989 | Preves .................................... | 381/109 |
| 5,128,566 | | 7/1992 | Killon et al. .......................... | 307/567 |
| 5,369,711 | * | 11/1994 | Williamson, III ..................... | 381/104 |
| 5,424,682 | * | 6/1995 | Gomez et al. ......................... | 330/254 |
| 5,682,119 | * | 10/1997 | Soda ..................................... | 330/254 |
| 5,757,940 | * | 5/1998 | Iinuma .................................. | 381/104 |
| 5,761,321 | * | 6/1998 | Tagomori .............................. | 381/104 |
| 5,812,029 | * | 9/1998 | Prentice ................................ | 330/254 |

FOREIGN PATENT DOCUMENTS

| | | | | |
|---|---|---|---|---|
| 2064249 | | 6/1981 | (GB) ................................ | H03F/3/26 |
| 04-319805 | * | 11/1992 | (JP) ...................................... | 330/252 |
| 2-39711 | * | 2/1990 | (JP) ...................................... | 381/104 |
| 55-109009 | * | 8/1990 | (JP) ...................................... | 381/104 |
| 3-255712 | * | 11/1991 | (JP) ...................................... | 381/104 |
| 4319805 | | 11/1992 | (JP) ................................. | H03G/3/10 |
| 59 172819 | | 9/1984 | (JP) ................................. | H03G/3/20 |

OTHER PUBLICATIONS

Lancaster, Don, "CMOS Cookbook", Howard W. Sam & Co., Inc., pp. 393–394, 1977.*
RCA Integrated Circuits Data Book, CA 3080, CA3080A Types, p. 200, 1976.*
8140 Electronics World + Wireless World 101 (1995) Apr., No. 1709, Sutton, Surrey GB pp. 320–321, "Low distortion attenuator for hi–fi".

* cited by examiner

*Primary Examiner*—Xu Mei
(74) *Attorney, Agent, or Firm*—Hogan & Hartson

(57) ABSTRACT

A volume control signal voltage is applied to one terminal of a resistor 50, flowing a current corresponding to the volume control signal voltage through the resistor 50. The other terminal of the resistor 50 is connected to the emitter of a transistor 54, in which a constant voltage is applied to the base. An input side transistor of a current mirror 57 is connected to the collector of the transistor 54, and constant current transistors 55 and 56 are connected downstream the transistor 54 and the output side transistor of the current mirror 57. The same current as through the resistor 50 is output from the upstream side of the constant current transistor 56. According to this output current, a GCA 102 is operated through a differential amplifier 58. The gain of the GCA 102 can thus be smoothly varied according to the volume control signal voltage. It is thus possible to obtain smooth variation of the attenuation of a signal under control according to changes in the volume control signal voltage.

6 Claims, 6 Drawing Sheets

ELECTRONIC VOLUME CONTROL CIRCUIT WITH CONTROLLED OUTPUT CHARACTERISTIC

BACKGROUND OF THE INVENTION

1. Field of the Invention

This invention relates to electric volume control circuits for controlling the volume or level of a signal according to the level of a control signal and, more particularly, to electronic volume control circuits which can control the audio signal level in a natural manner according to a control signal.

2. Prior Art

Recent audio and video apparatuses include pluralities of ICs. Many of these ICs are controlled according to digital signals from microcomputers provided in apparatuses. Inside or outside such an IC, a D/A (digital/analog) converter is provided. An electronic volume control circuit effects volume or level control according to a digital signal from such a microcomputer. Such an electronic volume controls the audio signal level according to the level of a control signal.

FIG. 1 shows an electronic volume such as above. An audio input signal is provided from an input terminal 101 on a GCA (gain control amplifier) 102, with the gain thereof varied according to a gain control signal and thereby level controlled. The level controlled signal obtained from the GCA 102 is led to an output terminal 103. The gain of the GCA 102 is controlled according to a digital signal from a microcomputer 104. The digital signal from the microcomputer 104 is a serial signal and is converted in a serial/parallel converter 105 into a parallel signal. The parallel signal is then converted into an analog signal in a D/A converter 106. The analog signal is applied to a variable reference voltage supply 107, which provides a reference voltage varying according to the control signal. According to changes in the reference voltage of the variable reference voltage supply 107, the level of a control signal from a controller 108 is changed to change the gain of the GCA 102.

The relation between the reference voltage of the variable reference voltage supply 107 and the gain of the GCA 102 is shown by the solid curve in FIG. 2. Reducing reference voltage of the variable reference voltage supply 107 increases attenuation of the audio input signal. In FIG. 2, −100 dB is regarded to be zero audio signal level. The staircase waveform shown along the solid curve in FIG. 2 shows steps of the digital signal obtained from the D/A converter 106. Usually, a 5-bit control signal is applied to the D/A converter 106, and a 32-step digital signal is provided.

In the circuit shown in FIG. 1, electronic volume is thus controlled according to the digital signal from the microcomputer.

In this circuit, however, the attenuation is only controlled in 32 steps over a wide range from 0 to −100 dB. In this case, when greatly attenuating the signal level, sufficient steps can not be secured in an attenuation range above about −30 dB in which the change of level is clearly understood by listeners. This means that the volume of sound in the audio apparatus is reduced largely when it is reduced by one step in a high level, and a listener feels departure from the normal sense of perception.

FIG. 3 shows the GCA 102 and the controller 108. In the GCA 102, the audio input signal from the terminal 101 is attenuated according to a gain control signal from terminals 208 and 209 and then led to the output terminal 103. The control circuit 108 includes a transistor 211, the base of which a control signal for attenuation from a terminal 212 is applied, a resistor 214, through which a current corresponding to the emitter voltage on the transistor 211 flows, and a differential amplifier 215, which compares a voltage at a point 0 and a reference voltage $V_{ref}$ and generates two control voltages for controlling the gain of the GCA 102. To the control signal input terminal 212, the output voltage of the variable reference voltage supply 107 is applied.

When the voltage of the attenuation control signal from the terminal 212 is zero, the transistor 211 is "off", and its emitter current is zero. In this state, a current flows through the resistor 214, providing a predetermined voltage determined by values of resistors 214, 218, and 219 at the point 0. The voltage at the point 0 in this state of the circuit is sufficiently low compared to the reference voltage $V_{ref}$.

Thus, transistors 220 and 221 are "on" and "off", respectively, and terminals 208 and 209 are at "H" and "L" levels, respectively.

In GCA 102, transistors 222 and 223 are "on" while transistors 224 and 225 are "off" in dependence on the "H" and "L" levels on the terminals 208 and 209 respectively.

In the meantime, currents corresponding to an audio input signal from the input terminal are generated at the collectors of transistors 226 and 227. Transistors 222 to 225 serve as a current distributor for constant current sources 228 and 229. When the transistors 222 and 223 are "on" while the transistors 224 and 225 are "off", the corrector signal at the transistors 226 and 227 is provided at the same level to the collectors of the transistors 222 and 223. The corrector signal from the transistors 222 and 223 is passed through current mirror circuits 230 to 232 for DC component removal and then led in a double end output form to the output terminal 103. The DC component at the output terminal 103 is superimposed on the reference voltage $V_{ref}$.

As shown above, when the control signal voltage is zero, the audio signal is not attenuated.

When the attenuation control signal voltage from the terminal 212 is increased, the transistor 211 is turned on to cause a current corresponding to its emitter current to flow through the resistor 219.

With this emitter current, the voltage at the point 0 is increased. The voltage increase at the point 0 reduces the corrector current in a transistor 220, causing a corrector current in a transistor 221. As a result, the voltage level at the terminal 208 is decreased, and the voltage level at the terminal 209 is increased.

As a result, the corrector current in the transistors 222 and 223 is reduced to reduce the audio input signal transmission rate (percentage) from 100%. In this way, the input audio signal is attenuated.

In the above way, the circuit shown in FIG. 3 can attenuate the input signal according to the control signal.

FIG. 4 shows the attenuation obtainable in the circuit shown in FIG. 3. In the graph, the ordinate is taken for the transmission rate (inverse of attenuation), and the abscissa is taken for the control signal level (=reference voltage).

As shown, the attenuation is increased with increasing control signal level. However, when the control signal level is below $V_{BE}$, the transistor 211 is "off", and a certain current is caused therethrough when the level $V_{BE}$ is exceeded, that is, the attenuation is suddenly increased when the signal level $V_{BE}$ is exceeded. Therefore, when the volume is quickly reduced, a listener feels a departure from the normal sense of perception.

SUMMARY OF THE INVENTION

An object of the invention is to provide an electronic volume control which permits the attenuation of signal to be varied smoothly with volume control voltage variation.

Another object of the invention is to provide an electronic volume control which permits satisfactory volume control in a narrow attenuation range.

According to the invention, a current corresponding to an electronic volume control voltage is flowed through a resistor, and the output current from a current generator is controlled with the current through the resistor. The current from the current generator may thus only be changed according to the current received from the resistor, and can be varied smoothly. In a case where current in a transistor is controlled by applying a volume control voltage to the base of the transistor, a point arises which is subject to great current changes in dependence on the on-of operation of the transistor. According to this invention, this can be avoided.

According to this invention, the state of a differential transistor output signal can be switched using a switching transistor. The signal attenuation can be greatly changed by operating the switching transistor. The signal attenuation thus can be made 100% when it is set to be above a certain value by a volume control demand. Electronic volume control is thus obtainable in a desirable low attenuation range. In many cases, volume control data is digital data provided from a microcomputer or the like. In such a case, the digital data is D/A converted into analog data, which is used for the attenuation control. The attenuation is therefore varied in the same number of steps over its entire range according to the digital data. According to the invention, the change of level by one step can be reduced where the attenuation is low.

DETAILED DESCRIPTION OF THE PREFERRED EMBODIMENTS

First Embodiment

Figure 1:
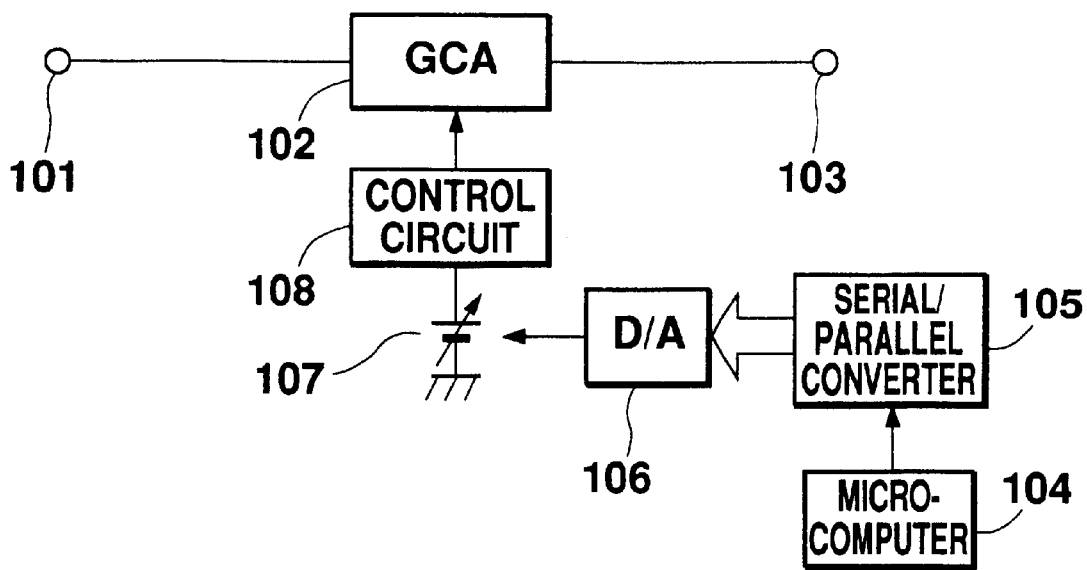
FIG. 1 is a block diagram showing a prior art electronic volume control circuit.
Figure 2:
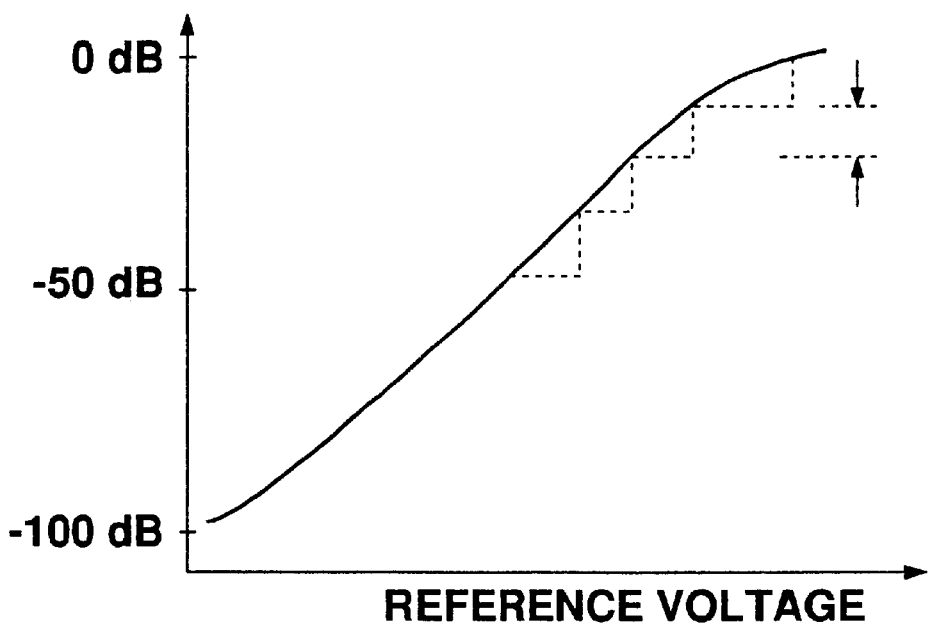
FIG. 2 is a graph showing a characteristic of a prior art circuit.
Figure 3:
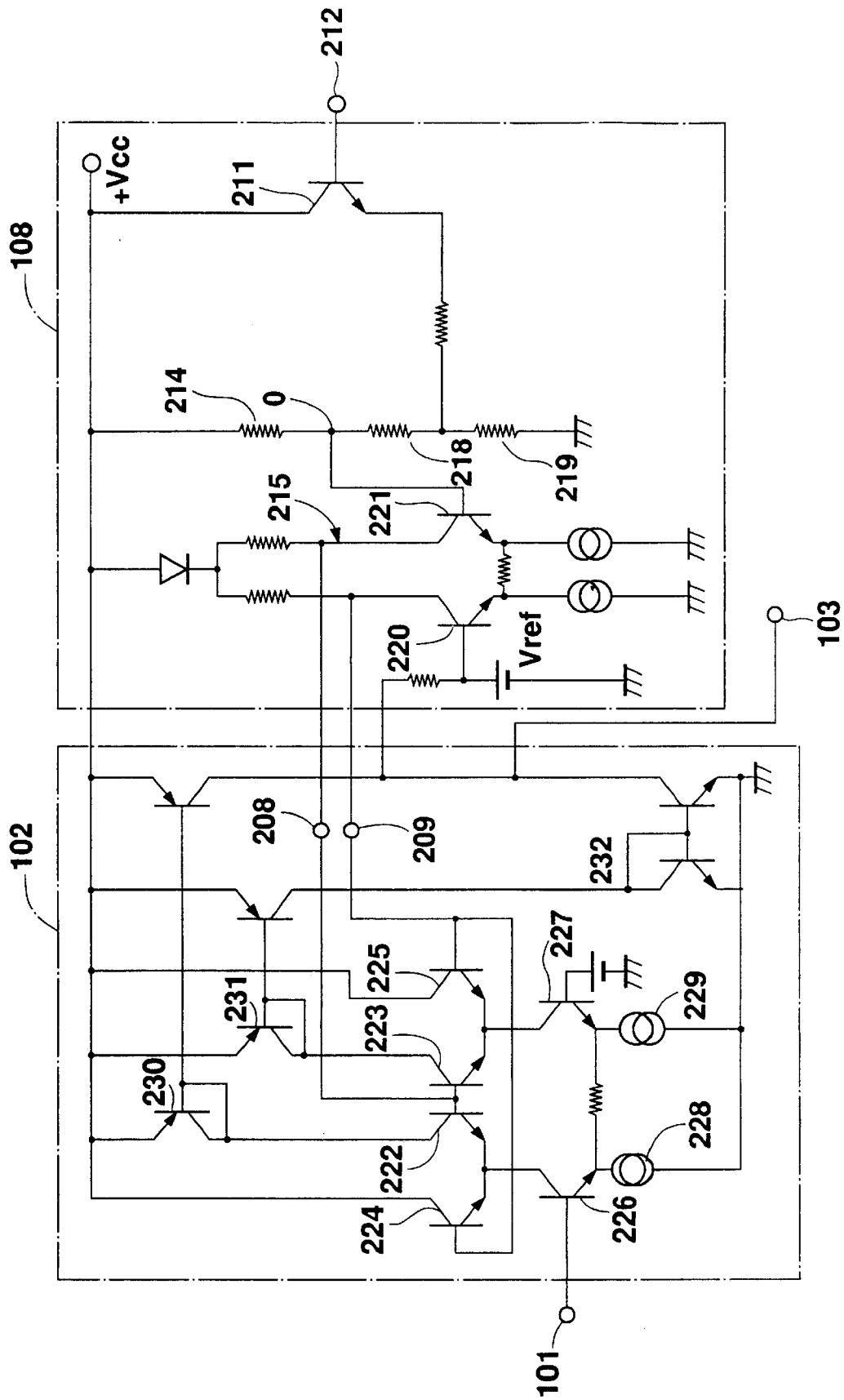
FIG. 3 is a circuit diagram showing the prior art electronic volume control circuit.
Figure 4:
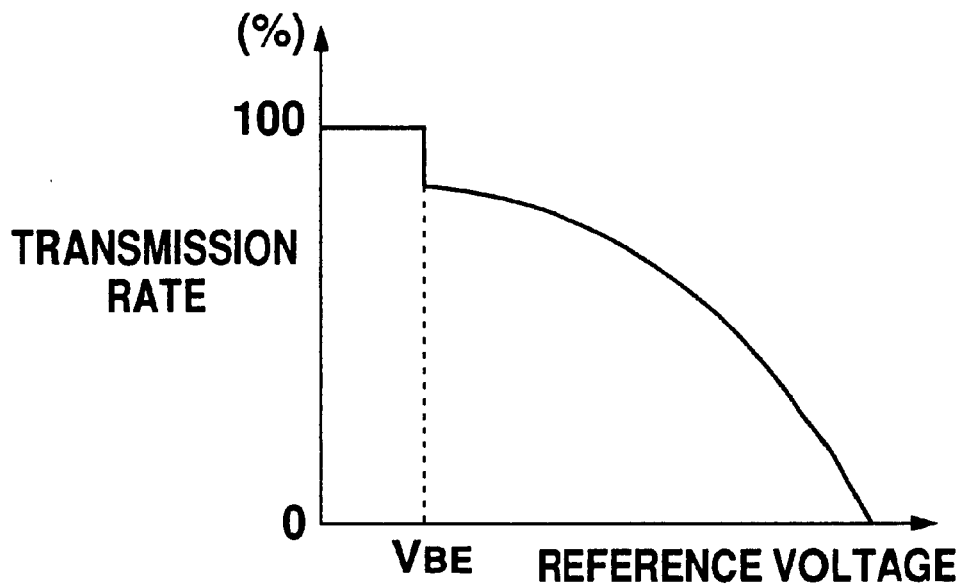
FIG. 4 is a graph showing a characteristic of the prior art circuit.
Figure 5:
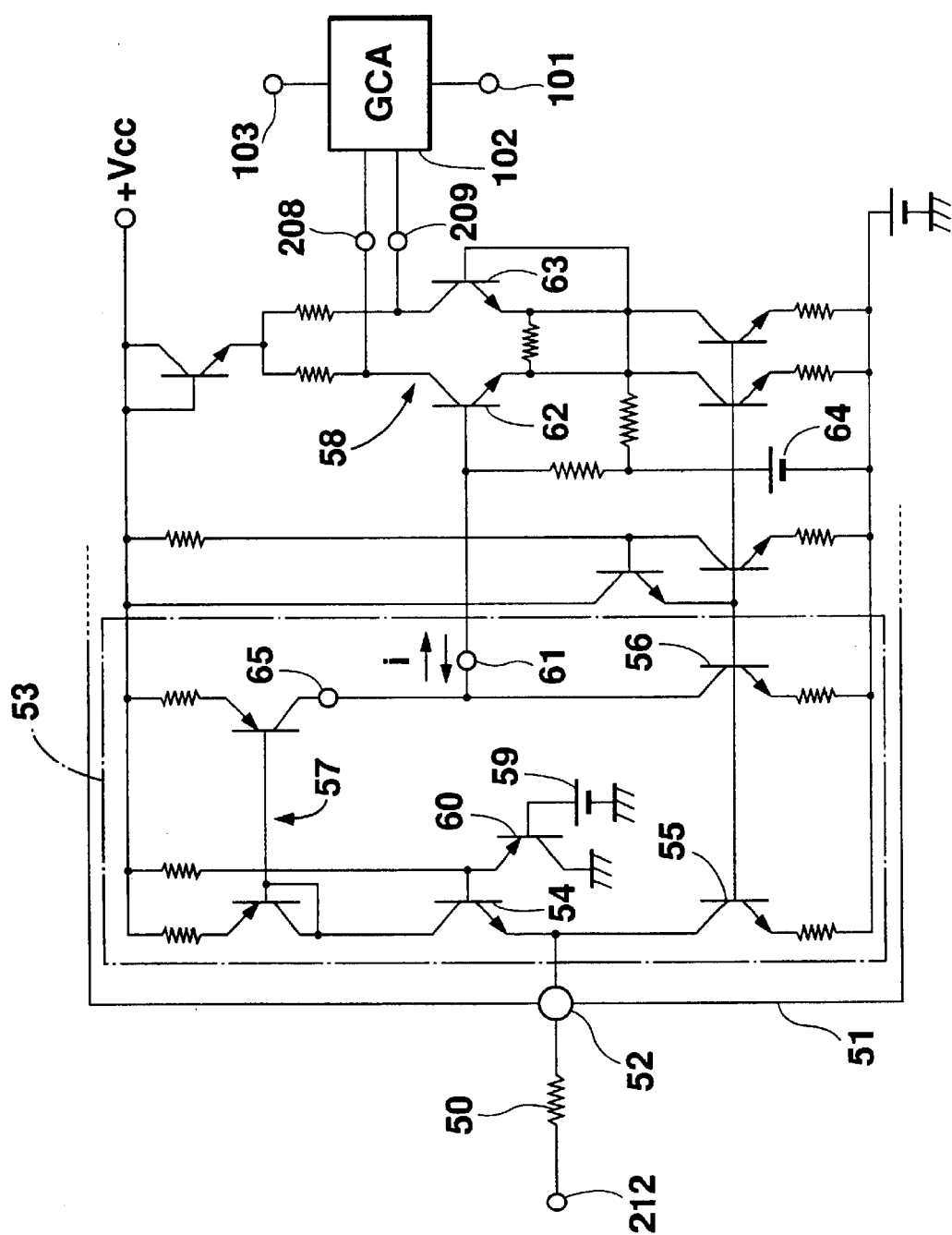
FIG. 5 is a circuit diagram showing a first embodiment of the electronic volume control circuit according to the invention.

FIG. 5 shows a first embodiment of the electronic volume control circuit. Reference numeral 51 generally designates an IC. Reference numeral 50 designates an external resistor 50 which has one terminal connected to a control signal input terminal 212 and the other terminal connected to a pin 52 of the IC 51. A current generator 53 which includes a transistor 54 with the emitter connected to the other terminal of the external resistor 50 noted above and the base with a constant voltage applied thereto, constant current sources 55 and 56, and a current mirror circuit 57, generates a current i equal to the current through the external resistor 50. A differential amplifier 58 is operable according to the output current from the current generator 53. A GCA 102 in FIG. 5, as in the circuit shown in FIG. 2, controls the level of a audio input signal to the terminal 101 according to the voltage level on the terminals 208 and 209, and outputs the level controlled audio signal to the terminal 103.

The circuit shown in FIG. 5 is constructed in an IC except for the external resistor 50. As the external resistor 50, a discrete component is used which is free from resistance changes with temperature changes. According to this invention, current through the external resistance 50 is utilized for electronic volume control. The current through the external resistor 50 is varied accurately linearly, and directly controls the GCA 102. By holding the differential amplifier 58 in a balanced active state, the operation in the circuit from the control signal input terminal 212 to the GCA 102 is free from any point stepped change in variations of status, and the state of the circuit can be varied linearly.

When the voltage of a constant voltage source 59 is equal to the voltage at the terminal 212, the external resistor 50 carries no current. Turn on voltages of transistors 54 and 60 are equal.

In this state, the current in the constant current source 55 flows through the transistor 54 and also through the current mirror circuit 57. The constant current sources 55 and 56 are set to provide an equal current, and no current flows through a point 61. With zero current at the point 61, an equal voltage is applied from a reference voltage supply 64 to the bases of transistors 62 and 63 of the differential amplifier 58. With the equal base voltage on the transistors 62 and 63, output signals at the output terminals 208 and 209 is at an equal level. With equal output signal level at the output terminals 208 and 209, the GCA 102 provides an intermediate gain. The level of the audio signal from the terminal 101 is thus amplified with the intermediate gain and then led to the output terminal 103.

When the voltage at the control signal input terminal 212 is increased from this state, current i is caused to flow from the external resistor 50 to the constant current source 55. As a result, the emitter current in the transistor 54, and also the current in the terminal 65 of the current mirror circuit 57, are reduced by i. A current i is thus caused from the reference voltage source 64 through the point 61 to the constant current source 56, thus reducing the base voltage on the transistor 62. The reduction of the base voltage on the transistor 62, causes a level increase of the output signal at the output terminal 209 and a level reduction of the output signal at the output terminal 208, thus reducing the gain of the GCA 102 to greatly attenuate the level of the input signal obtained at the output terminal 103.

When the volt age at the terminal 212 is reduced, current i is caused from the transistor 54 to the external resistor 50, thus increasing the collector current in the transistor 54 and also the current at the terminal 65 of the current mirror circuit 57 by i. A current i is thus caused from the point 61 to the reference voltage source 64, thus increasing the base voltage on the transistor 62. The increase of the base voltage on the transistor 62 causes a level reduction of the output signal at the output terminal 208 and a level increase of the output signal at the output terminal 209, thus increasing the gain of the GCA 102 to cause a slight attenuation of the level of the input signal obtained at the output terminal 103, in other words, reducing the voltage at the control signal input terminal 212 reduces the attenuation.

It will be appreciated that varying the voltage at the terminal 212 shown in FIG. 5 has no effects of turning on or off any transistor, and thus no sharp level changes result.

In addition, since the external resistor 50 is a discrete component, its resistance is not changed with temperature changes or the like and an accurate current is generated from the current generator for accurate control of the GCA 102.

Figure 6:
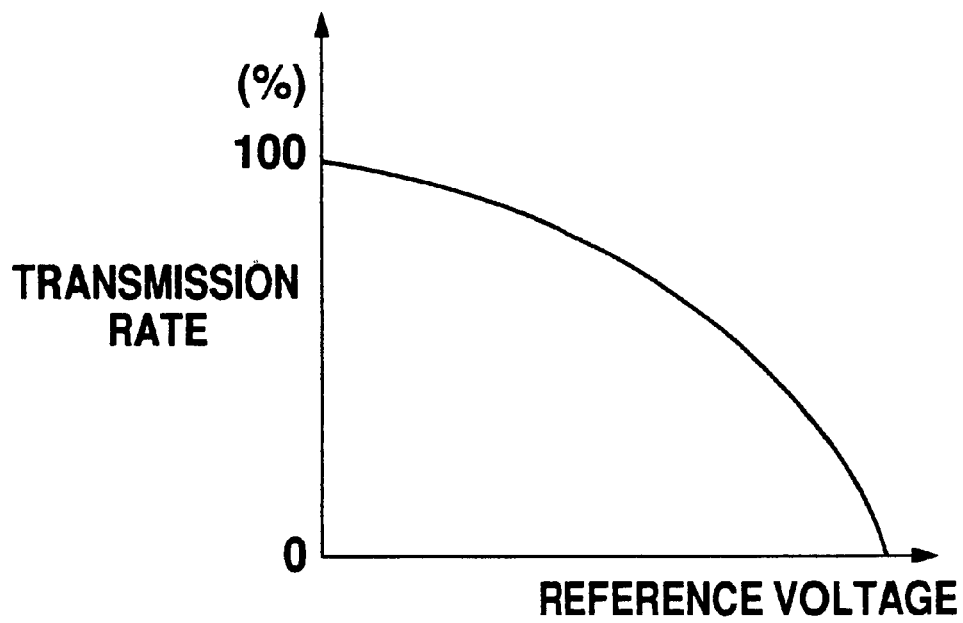
FIG. 6 is a graph showing a characteristic of the first embodiment.

The relation between the transmission (inverse of attenuation) of signal in the GCA 102 and the control signal voltage applied to the control signal input terminal 212, is as shown in FIG. 6. As shown, the circuit shown in FIG. 5 permits accurate level control of an audio signal in a natural manner according to a control signal.

Note that the control voltage applied to a control terminal 212 may not be an analogue voltage which was obtained through D/A conversion.

According to this invention, it is thus possible to provide an electronic volume control circuit which can control the input signal level according to the control signal level.

Particularly, according to the invention it is possible to provide an electronic volume control circuit which can accurately control the level of an audio signal in a natural manner according to a control signal.

Moreover, in this invention, as a discrete component can be used, the resistance of which is not changed with temperature changes or the like, can be used for an external resistor, it is possible to permit generation of an accurate current from the current generator.

Second Embodiment

Figure 7:
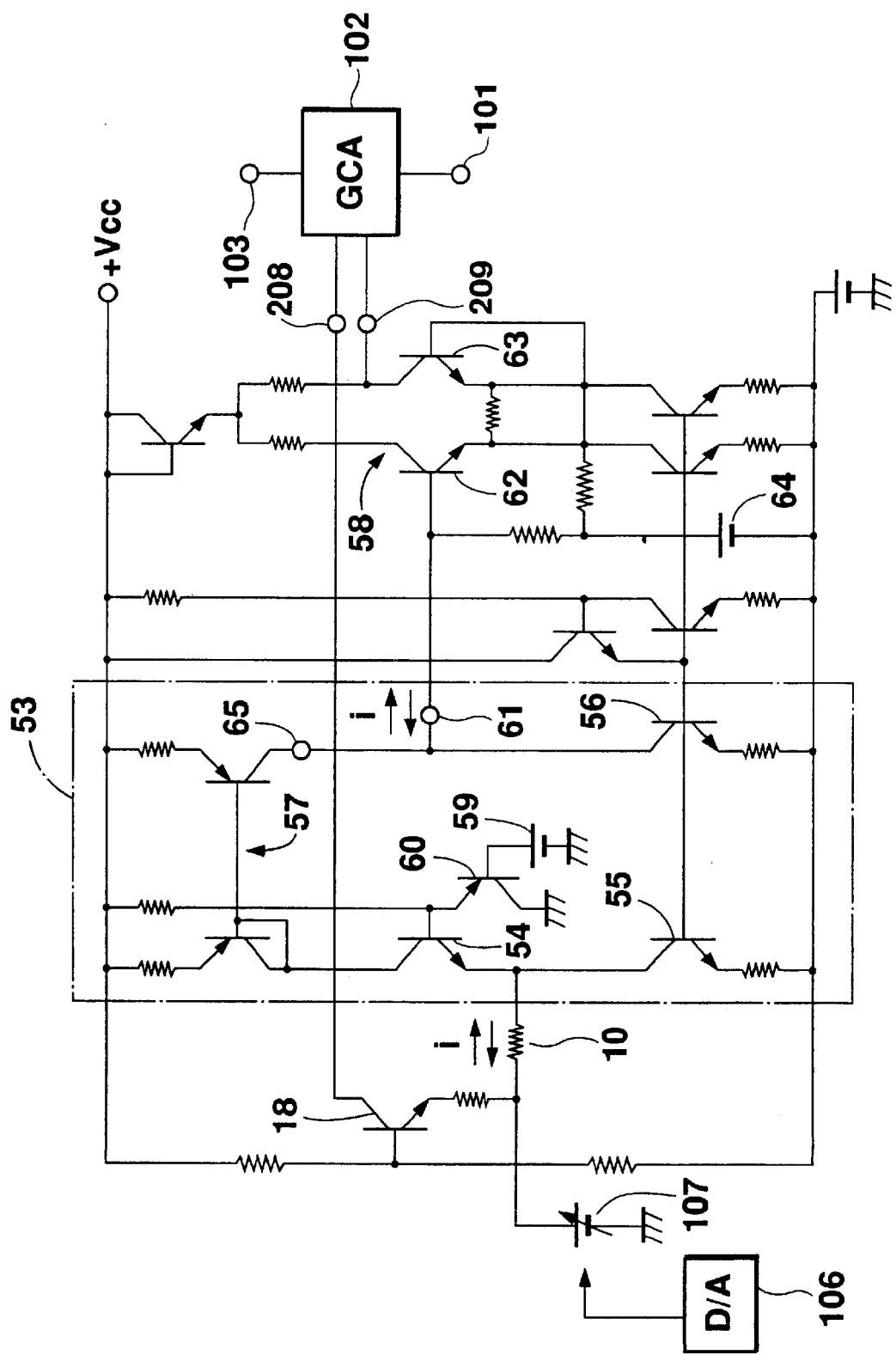
FIG. 7 is a circuit diagram showing a second embodiment of the electronic volume control circuit according to the invention.

FIG. 7 shows a second embodiment of the electronic volume control circuit according to this invention. This embodiment comprises a variable reference voltage source 107 which applies a voltage to one terminal of a resistor 10. A transistor 18 detects reduction of the voltage of the variable reference voltage source 107 to be below a predetermined voltage, and thereupon provides a detection signal to forcibly switch the output signal level at the output terminals 208 and 209 of the differential amplifier 58 to "L" level. The transistor 18 has a base with a constant voltage applied thereto, the collector connected to the output terminal 208, and the emitter connected to one terminal of the resistor 10 and also to the variable reference voltage source 107.

In FIG. 7, parts corresponding to those in FIG. 5 are designated by the same reference numerals.

Figure 8:
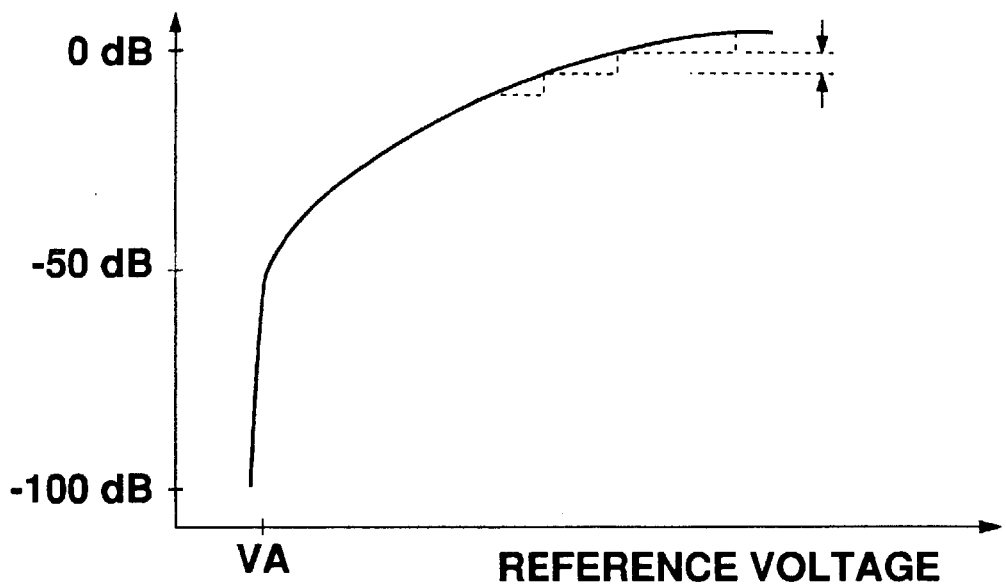
FIG. 8 is a graph showing a characteristic of the second embodiment.

The relation between the gain of the GCA 102 and the reference voltage of the variable reference voltage source 107 is shown in FIG. 8. As shown, reducing the reference voltage of the variable reference voltage source 107 increases the attenuation. As is seen from FIG. 8, the operation in the circuit shown in FIG. 7 is different on the opposite sides of a voltage VA. In the voltage range above the voltage VA, a usual attenuation curve is obtained. In the voltage range below the voltage VA, the audio signal input is muted. The voltage VA is set to around –50 dB, which corresponds to the lower limit of the volume capable of being heard by a listener. Thus, for levels lower than this level the signal is muted without staircase control. Doing so permits using all the 32 steps for a level range of –50 to 0 dB. In this range (high volume range) finer steps are thus provided, thus providing for more natural sense of hearing over the entire electronic volume control range.

Specifically, when the voltage of the variable reference voltage source 107 becomes lower than VA, the switching transistor 18 is turned on to the voltage at the output terminal 208 of the differential amplifier 59 "L" level and thus make the gain of the GCA 102 zero, thus muting the input signal.

When the voltage of the variable reference voltage source 107 is above the predetermined voltage VA, the switching transistor 18 is "off". No current thus flows through the resistor 10 so long as the voltage of the constant voltage source 59 and the voltage of the variable reference voltage source 107 are equal.

In this state, the GCA 102 is providing an intermediate gain. The audio signal input from the terminal 101 is thus amplified with the intermediate gain and led to the output terminal 103.

When the voltage of the variable reference voltage source 107 is increased from this state, the gain of the GAC 102 is increased, and the audio signal from the terminal 101 is thus amplified with increased gain and led to the output terminal 103.

For the gain of the GCA 102 in this case, 31 steps can be used for a volume range of about –50 t 0 dB, that is, finer steps can be obtained in this range (i.e., high volume range).

A natural sense of hearing can thus be provided over the entire electronic volume control range.

When the voltage of the variable reference voltage source 107 becomes lower than the predetermined voltage VA, the switching transistor 18 is turned on, thus decreasing the level of the output signal at the output terminal 208 to "L" level. The gain of the GCA 102 is thus reduced to –100 dB corresponding to the muting state. The input audio signal from the terminal 101 is thus muted, and no signal appears at the output terminal 103.

Thus, the circuit shown in FIG. 7 can levelly control a audio signal in a natural manner according to an analog control signal obtained after D/A conversion.

Figure 9:
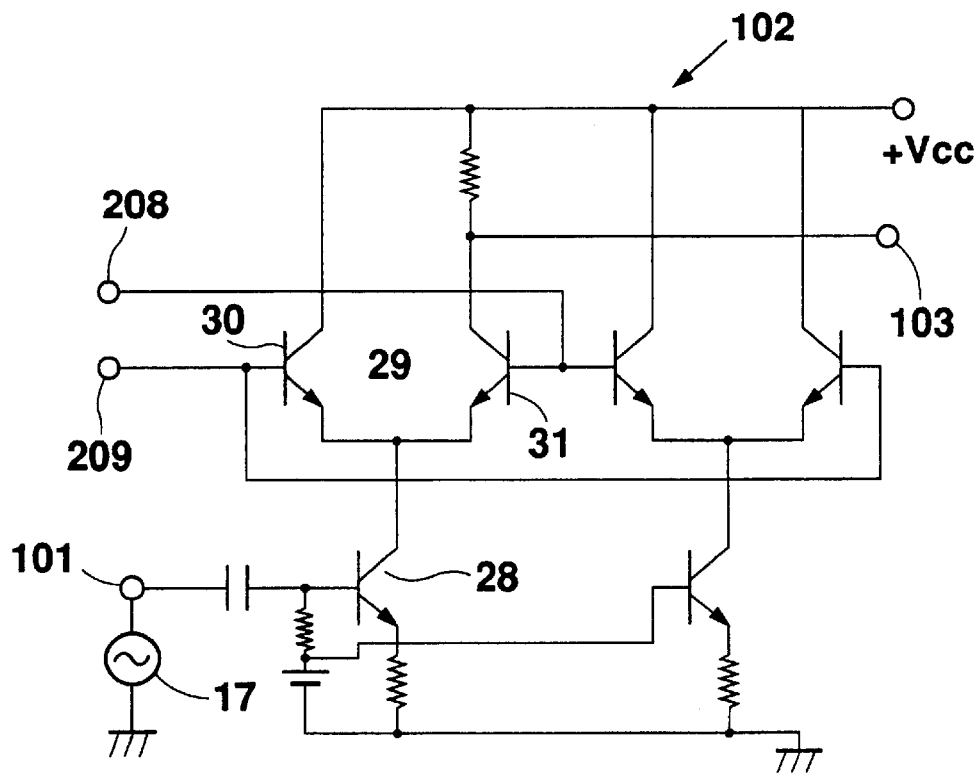
FIG. 9 is a circuit diagram showing an example of GCA according to the invention.

FIG. 9 shows an example of the circuit construction of the GCA 102 shown in FIG. 7. In this GCA circuit, the DC voltage at the output terminal 103 is fixed irrespective of the output signal levels at the output terminals 208 and 209, and the AC signal level is determined by the current division ratio of the collector current in a transistor 28. This current division ratio is varied with current through transistors 30 and 31 in a differential amplifier 29. When the output signal level at the output terminal 19 is so high that the collector current from the transistor 28 entirely flows into the transistor 31, the gain is unity. On the other hand, when the output signal level on the output terminal 19 is so low that the collector current from the transistor 28 entirely flows into the transistor 30, the gain is zero.

Thus, with the circuit shown in FIG. 5 the input signal can be muted with output signal level reduction at the output terminal 19.

As shown above, this embodiment can levelly control a audio signal in a natural manner according to an analog control signal obtained after D/A conversion.

What is claimed is:

1. An electronic volume control circuit for controlling the level of a signal according to a volume control signal voltage comprising:

a resistor, to one terminal of which said volume control signal voltage is applied to cause a current through it according to said volume control signal voltage;

a current generator for generating an output current according to said current caused through said resistor;

a differential amplifier for generating an output signal according to said output current from said current generator; and a level control circuit for controlling the level of said signal under process according to said output signal of said differential amplifier:

wherein said current generator includes:

a current mirror circuit having a pair of transistors through which the same current is passed;

a pair of constant current transistors through which said current through said pair of transistors in said current mirror circuit is passed; and a control transistor inserted between one of said constant current transistors and one of said pair of transistors in said current mirror circuit for receiving a constant voltage at the base;

the other terminal of said resistor being connected to the emitter of said control transistor;

current through said current mirror circuit being controlled according to said current through said resistor, thereby outputting the same current as said current through said resistor from a juncture point between the other transistor in said current mirror circuit and the other constant current transistor.

2. The electronic volume control circuit according to claim 1, which is accommodated in an integrated circuit except for said resistor being provided as an external resistor.

3. The electronic volume control circuit according to claim 1, further comprising:

a variable reference voltage source for providing an output reference voltage variable according to an electronic volume control signal, said output reference voltage from said variable reference voltage source being applied to said one terminal of said resistor.

4. An electronic volume control circuit for controlling the level of a signal according to a volume control signal voltage comprising:

a resistor, to one terminal of which said volume control signal voltage is applied to cause a current through it according to said volume control signal voltage;

a current generator for generating an output current according to said current caused through said resistor;

a differential amplifier for generating an output signal according to said output current from said current generator;

a level control circuit for controlling the level of said signal under process according to said output signal of said differential amplifier;

a variable reference voltage source for providing an output reference voltage variable according to an electronic volume control signal;

said output reference voltage from said variable reference voltage source being applied to said one terminal of said resistor, and a switching controller for switching the state of said output signal from said differential amplifier when said output voltage from said variable reference voltage source becomes a predetermined value.

5. The electronic volume control circuit according to claim 4, wherein said switching controller includes:

a switching control transistor with the emitter with said output voltage of said variable reference voltage source applied thereto, the base with said reference voltage applied thereto, and the collector connected to the output side of said differential amplifier;

said differential amplifier output signal state being changed in two stages by on-off operation of said switching control transistor.

6. The electronic volume control circuit according to claim 5, wherein:

when said voltage of said variable reference voltage source becomes lower than a predetermined value, said switching control transistor is turned on to cause attenuation of said output signal of said differential amplifier.

* * * * *